United States Patent [19]

Hathaway

[11] Patent Number: 5,067,583

[45] Date of Patent: Nov. 26, 1991

[54] POLYMER-FILLED AUDIO LOUDSPEAKER CABINET

[76] Inventor: Dana B. Hathaway, 9 Swetts Hill, Amesbury, Mass. 01913

[21] Appl. No.: 563,262

[22] Filed: Aug. 6, 1990

[51] Int. Cl.[5] .......... H05K 5/00

[52] U.S. Cl. .......... 181/151; 381/205

[58] Field of Search .......... 181/144, 148, 150, 151, 181/155, 156, 199; 381/205

[56] References Cited

U.S. PATENT DOCUMENTS

| | | | |
|---|---|---|---|
| 4,129,752 | 12/1978 | Griffin, Jr. | 181/148 X |
| 4,177,872 | 12/1979 | Watanabe et al. | 181/148 X |
| 4,596,365 | 6/1986 | Jagborn | 181/151 |
| 4,754,852 | 7/1988 | Mulé et al. | 181/144 X |
| 4,802,551 | 2/1989 | Jacobsen | 181/148 X |

*Primary Examiner*—Brian W. Brown
*Attorney, Agent, or Firm*—Samuels, Gautheir & Stevens

[57] ABSTRACT

A loudspeaker cabinet which is formulated from a non-foamed, molded, filled polymer having between 20–90% inert filler and a density of between 1.0–6.0 gm/cm$^3$. Preferably the polymer is a polyester.

7 Claims, 1 Drawing Sheet

POLYMER-FILLED AUDIO LOUDSPEAKER CABINET

BACKGROUND OF THE INVENTION

The present invention relates to loudspeaker enclosures, and more specifically, to loudspeaker enclosures which minimize sound output coloration caused by sympathetic cabinet vibration.

Loudspeakers and loudspeaker designs have been well known since the 1940's. Over the past 40 years a great deal of work has been devoted to the design of loudspeakers. They are complex devices. Incorporated in a complete system are a group of dynamic sub-systems integrated into a unified sound producing package. System integration is critical to the absolute performance of the design. One of the most significant yet least controllable sub-systems is the enclosure itself and the potential it has for coloring and distorting the sonic output of the system.

The ideal loudspeaker enclosure would be infinitely stiff and rigid. It would secure the drivers in their fixed positions and contribute nothing to the sonic character of the system. In reality, enclosures are rather elastic structures with dynamic characteristics. Reactions to internal pressures and drive vibration cause the cabinet itself to resonate and produce sonic output. At specific resonant frequencies the output from the cabinet can be as strong as the direct driver output. This sound is chiefly parasitic in nature. It is fundamentally unlike the output of an electro-acoustic transducer, which has a defined and controlled response from an electrical input signal to an acoustic output—or transfer function. Typically, loudspeaker enclosures are formed by the joining of six or more flat panels, each of which exhibit flat plate resonances.

Countermeasures can be taken to try and control the enclosure vibration. These include using select materials, bracing, mass and stiffness enhancement to control panel resonance and vibration, additional damping materials, and driver isolation mounting. Many enclosures are merely soundproof boxes formed of wood composite and filled with a sound absorbent material.

Recently, attempts have been made to reduce enclosure vibration and the corresponding sound output behavior of loudspeaker enclosures. The techniques employed have been attempts to control panel vibrations with extensional damping materials and/or the use of mechanical bracing, tension rods, or trusses.

One approach applies a layer or layers of a high loss bituminous mastic to the inside of the cabinet walls. Vibration energy is dissipated in the damping material through the mechanism of extensional damping. Another approach employs a threaded rod which screws into two opposing internal surfaces of the enclosure. This rod exerts tension on the enclosure and attempts to limit its ability to vibrate. Still another approach using a complex system of braces and trusses attempts to make the mechanical impedance of the enclosure walls sufficiently high at the frequencies of interest so that no motion is imported to the cabinet walls.

These approaches all fail in practice to eliminate significant amounts of enclosure vibration. The addition of damping material attempts to dissipate energy in a moving cabinet wall by changing the kinetic energy into thermal energy. This is impossible to do with any consistency and efficiency. The second approach attempts to stop flexing on six different vibrating panels with a single brace between two of the six. The third approach is inordinately difficult to achieve in practice because the mis-alignment of the brace(s) or a less than adequate mechanical joint(s) greatly reduces the high mechanical impedances required and, in fact, may produce more vibration rather than less.

Additionally, an enclosure formed from flat panels will exhibit a non-uniform radiation loading of the loudspeaker as a function of frequency, resulting in acoustical diffraction. It has been shown in the art that the optimum shape requires compound curves and approaches a sphere.

SUMMARY OF THE INVENTION

An object of the invention is to provide an improved cabinet for loudspeakers using a formed, dense polymer material for its construction.

Another object of the present invention is to provide a dense cabinet for loudspeakers with improved damping properties.

Another object of the present invention is to provide a dense polymer loudspeaker cabinet that will reduce the cost of loudspeaker manufacture.

Another object of this invention is to provide a polymer loudspeaker cabinet which is unique in appearance and astheticly decorative as well as functional.

Another object of this invention is to provide a dense-filled polymer cabinet and baffle to which the loudspeaker elements, such as a woofer and a tweeter, are directly mounted and integrally attached to the dense-filled polymer cabinet.

Broadly, the present invention uses a material for cabinet construction whose physical properties permit the molding of a loudspeaker cabinet that is inherently resistant to mechanical vibration. Because enclosures made of this material can be molded, loudspeaker cabinets that have curved walls can be easily made. The elimination of right angles, sharp corners and parallel flat surfaces are known to be of benefit in the reduction of sound wave diffraction and internal standing waves.

Our invention relates to a design and material of construction for loudspeaker cabinets that provide loudspeakers with a vastly improved performance, cost advantage and asthetic design.

The invention embodies a loudspeaker cabinet comprising an enclosure and a baffle formed of a cast or molded filled polymer. The polymer has between about 20 to 90% inert filler therein. The baffle preferably formed of the same polymer is secured to the front of the enclosure. The baffle has first and second openings therein in register with a woofer and a tweeter secured to the enclosure. In a preferred embodiment, the density of the filled polymer is between about 1.0 to 6.0 gm/cm$^3$.

The method of the invention comprises forming an enclosure and a baffle, from a filled polymer molded in a shape consistent with the expected acoustic characteristics of a loudspeaker system, the polymer having between about 20 to 90% inert filler, assembling acoustical components to the baffle and securing the baffle to the enclosure to form the loudspeaker cabinet.

BRIEF DESCRIPTION OF THE DRAWING(S)

DESCRIPTION OF THE PREFERRED EMBODIMENT(S)

The polymers used for the cabinet of the preferred embodiment are generally those used in the trade for cultured onyx and cultured marble manufacturing. An example would be polylite® 32-138 cultured marble resin which is a unsaturated polyester resin, Reichhold Chemicals, Inc. As defined for this disclosure, the term cultured onyx or cultured marble would be those materials meeting the standards established by the Cultured Marble Institute and/or American National Standards Institute, Inc. These terms cultured marble or cultured onyx are also well recognized in the trade, see Modern Plastics Encyclopedia, 1989, pages 134–135. More specifically, the polymer has a molecular weight of between 60,000 to 1,000,000 Daltons. The density of the filled polymer is between 1.0 to 6.0 gm/cm$^3$.

The shape and dimensions for a loudspeaker cabinet which comprises an enclosure and baffle are arranged to minimize diffraction, resulting in a shape with radiused vertices and three dimensional radii at all corners, such radii being a significant fraction of the cabinet's overall dimensions. These basic criteria, for the design of a loudspeaker, are well known in the art, see Olson, H. F., *Acoustical Engineering*, D. VanNostrand Company, Inc., 1957, which publication is incorporated by reference into this disclosure in its entirety.

An enclosure and a baffle were molded from catalyzed unsaturated polyester resin filled with calcium carbonate (20/80 w/w) 2.2 gm/cc. The resulting material is commonly referred to as "Cultured Marble" or "Cultured Onyx". In the manufacture of the enclosure and baffle, standard industry techniques are used. These are well within the skill of the art and need not be described in detail. Further, if certain textured finishes are required for a loudspeaker cabinet then various gel coats may be used on the mold to achieve this affect.

Figure 2:
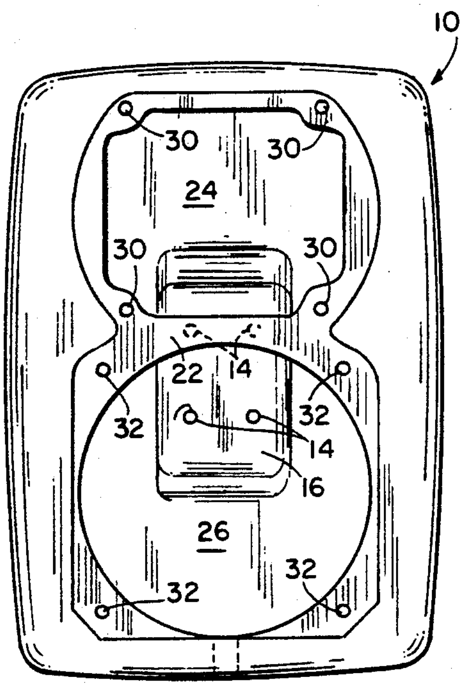
FIG. 2 is a front view of the cabinet of FIG. 1.
Figure 1:
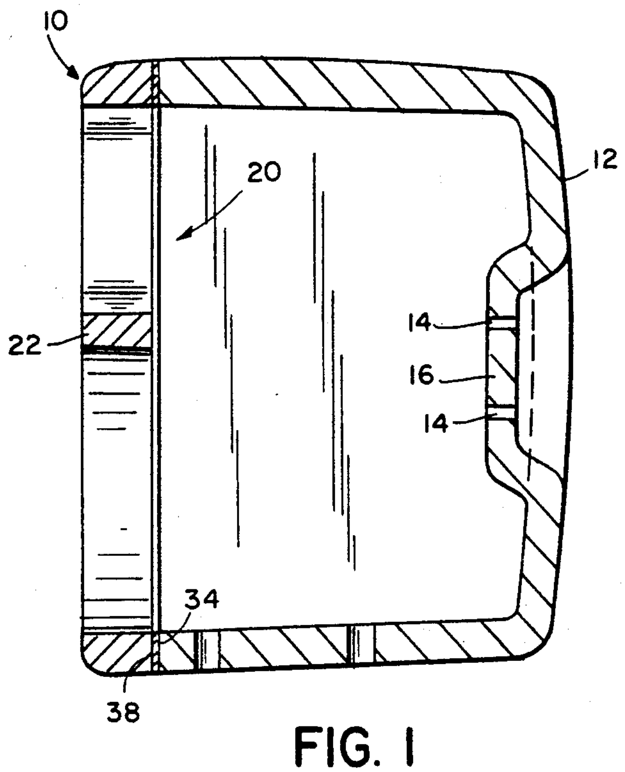
FIG. 1 is a side view of a loudspeaker cabinet embodying the invention.

Referring to FIGS. 1 and 2, a cabinet is generally shown at 10 and comprises an enclosure 12. The enclosure includes through holes 14 for input connectors and a reinforcing rib 16 formed on the back wall of the enclosure 12.

A baffle 20 includes a reinforcing rib 22 centrally disposed across the baffle and a through hole 24 for the tweeter and a through hole 26 for the woofer.

Pilot holes 30 to secure the tweeter and pilot holes 32 to secure the woofer to the baffle are formed in the front face of the baffle 20.

The edge 34 of the enclosure 12 is adhered to the edge 38 of the baffle 20 such as by an epoxy adhesive.

Figure 3:
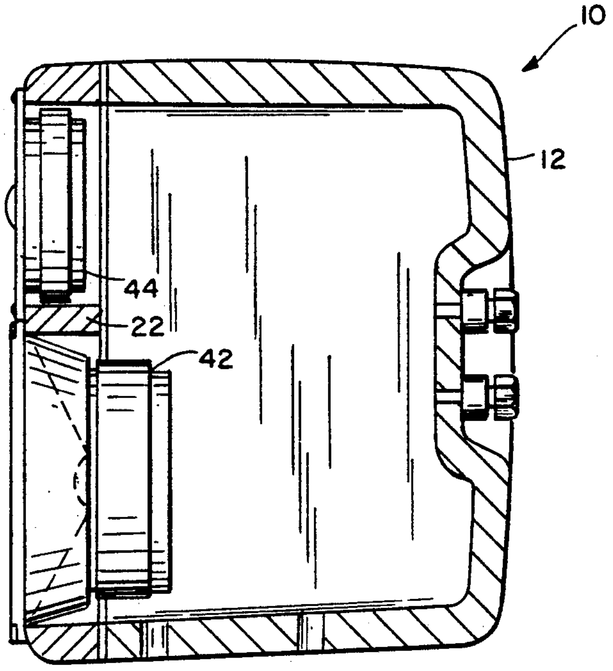
FIG. 3 is a side view of the cabinet having loudspeaker components mounted thereon.

Referring to FIG. 3, a woofer 42 and a tweeter 44 are shown secured directly to the baffle 20. These components are directly mounted to the baffle thereby achieving an integral design which produces the desired mechanical and acoustical benefits.

The filler can vary from 20–90% by weight based on the total weight of the composition. Typical fillers that can be used include but are not limited to calcium carbonate.

The finally molded sheets have a density of between about 1.0 to 6.0 gm/cm$^3$ and the polymer in the enclosure has a molecular weight of between about 60,000 to 1,000,000 Daltons.

Other suitable polymers would include but are not limited to polycarbonates, polysulfones, polyvinylchlorides, polyvinyl acetates or polyurethanes.

Various combinations of polymers and fillers can be used and are within the scope of the invention. It is preferred the enclosure and baffle be of the same filled polymer.

Based on initial audio observations, a loudspeaker system using the enclosure of the invention has superior control over vibrational energy and minimizes the deflection of its cabinet wall surfaces at the same frequency as a prior art speaker.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. A loudspeaker cabinet which consists of:

an enclosure having a front and a baffle each formed from a non-foamed molded filled polymer having between 20–90% inert filler and a density of between 1.0–6.0 gm/cm$^3$;

the polymer selected from the group which consists of polyester, polycarbonate, polysulfone, polyvinyl chloride, polyvinyl acetate and/or polyurethane; and the molded baffle secured to the font of the enclosure and having first and second openings therein, the enclosure and baffle having mounting surfaces for directly securing loudspeaker components thereto.

2. The loudspeaker of claim 1 wherein the enclosure is made of molded polymer sheet materials.

3. The loudspeaker of claim 1 wherein the polymer is a polyester.

4. The loudspeaker of claim 1 wherein the polymer is a polycarbonate.

5. The loudspeaker of claim 1 wherein the polymer is a polysulfone.

6. The loudspeaker of claim 1 wherein the polymer is selected from the group consisting of polyvinyl chloride, polyvinyl acetate or polyurethane.

7. The loudspeaker of claim 1 wherein the molecular weight of the polymer is between about 60,000 to 1,000,000 Daltons.

* * * * *